US008842458B2

(12) United States Patent
Gronlund et al.

(10) Patent No.: US 8,842,458 B2
(45) Date of Patent: *Sep. 23, 2014

(54) REDUCED POWER CONSUMPTION CONTENT-ADDRESSABLE MEMORY

(71) Applicant: Broadcom Corporation, Irvine, CA (US)

(72) Inventors: Christopher Gronlund, Kent, WA (US); Eric Hall, Bellevue, WA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/080,464

(22) Filed: Nov. 14, 2013

(65) Prior Publication Data
US 2014/0071727 A1    Mar. 13, 2014

Related U.S. Application Data

(63) Continuation of application No. 12/930,571, filed on Jan. 10, 2011, now Pat. No. 8,587,979.

(60) Provisional application No. 61/459,528, filed on Dec. 13, 2010.

(51) Int. Cl.
G11C 15/04 (2006.01)

(52) U.S. Cl.
CPC ..................................... G11C 15/04 (2013.01)
USPC ...................... 365/49.17; 365/49.15; 365/227

(58) Field of Classification Search
CPC ...... G11C 15/04; G11C 15/046; G11C 15/00; G11C 15/043; G11C 7/067; G11C 11/413; G11C 5/147
USPC ............ 365/49.1, 49.11, 49.12, 49.13–49.18, 365/189.07, 189.08, 203, 206; 711/108, 711/128
See application file for complete search history.

(56) References Cited

U.S. PATENT DOCUMENTS 7,920,398 B1 * 4/2011 Khanna et al. ............... 365/49.1
8,587,979 B2 * 11/2013 Gronlund et al. .......... 365/49.17
2004/0141348 A1 * 7/2004 Shau ............................... 365/49

* cited by examiner

Primary Examiner — Hien Nguyen
(74) Attorney, Agent, or Firm — Oblon, Spivak, McClelland, Maier & Neustadt, L.L.P.

(57) ABSTRACT

According to one disclosed embodiment, a content-addressable memory (CAM) system configured for reduced power consumption includes a sensing circuit utilized to apply a sense voltage to a matchline of the CAM system, a valid bit cell coupled to the matchline, and a power cut-off circuit configured to isolate the sense voltage from the matchline when an invalid validity state is stored in the valid bit cell, thereby reducing power consumption by the CAM system. In one embodiment, the power cut-off circuit isolates the sense voltage from the matchline by decoupling the sensing circuit from a control signal when an invalid validity state is stored in the valid bit cell.

20 Claims, 5 Drawing Sheets

REDUCED POWER CONSUMPTION CONTENT-ADDRESSABLE MEMORY This is a continuation of application Ser. No. 12/930,571 filed Jan. 10, 2011.

The present application claims the benefit of and priority to a provisional patent application entitled "System and Method for Reducing Power Consumption in a Content-Addressable Memory," Ser. No. 61/459,528 filed on Dec. 13, 2010. The disclosure in that provisional application is hereby incorporated fully by reference into the present application.

BACKGROUND OF THE INVENTION

1. Field of the Invention

The present invention is generally in the field of memory systems and devices. More particularly, the present invention is in the field of content-addressable memory (CAM) systems and devices.

2. Background Art

Many computer-based technologies rely on high speed access to data storage in order to create as interactive an experience as possible. In an environment where data sets are growing significantly larger, merely relying on larger designed bandwidths and higher bus and processor frequencies has diminishing returns. As a result, methods to reduce monolithic processor usage and data bus bandwidth requirements have been developed over time. One example method is the use of content-addressable memory (CAM) in order to speed up and offload search processes from conventional processors and data buses.

CAM is a type of memory that can take an input search word or series of bits, compare it against each and every entry within the CAM, and output a match location, all subject to a single clock cycle throughput. A CAM system improves high speed processing in at least two ways: first, it can perform an exhaustive search very quickly, and second, it may obviate a need to transfer a large data set to and from a memory array in order to perform a conventional search using, for example, a conventional monolithic processor. In the most basic case, where a data set is already resident in the CAM system and may be used for multiple searches, the only data bus bandwidth required is the bandwidth used to designate the search word to the CAM system initially and the bandwidth used to return a result. Even where a new data set must be transferred into a CAM system before each search, the high speed search of a CAM system typically makes up for any time spent on data transfer. As such, CAM systems are often preferred for applications benefitting from high speed searches, such as parametric curve extraction, media encoding/decoding, and internet protocol (IP) packet classification and forwarding, as examples.

However, a major drawback of conventional CAM systems is that in order to provide their high speed search results, the entire CAM array is typically powered and operational, which makes conventional CAM systems relatively expensive to use due to high power consumption and the on-chip space used to provide such power.

Thus, there is a need to overcome the drawbacks and deficiencies in the art by providing a compact and inexpensive system for reducing power consumption by a CAM.

SUMMARY OF THE INVENTION

The present application is directed to system and method for reducing power consumption in a content-addressable memory, substantially as shown in and/or described in connection with at least one of the figures, as set forth more completely in the claims.

BRIEF DESCRIPTION OF THE DRAWINGS

FIG. 1b illustrates a more detailed circuit schematic of a portion of the system shown in FIG. 1a.

DETAILED DESCRIPTION OF THE INVENTION

Figure 1A:
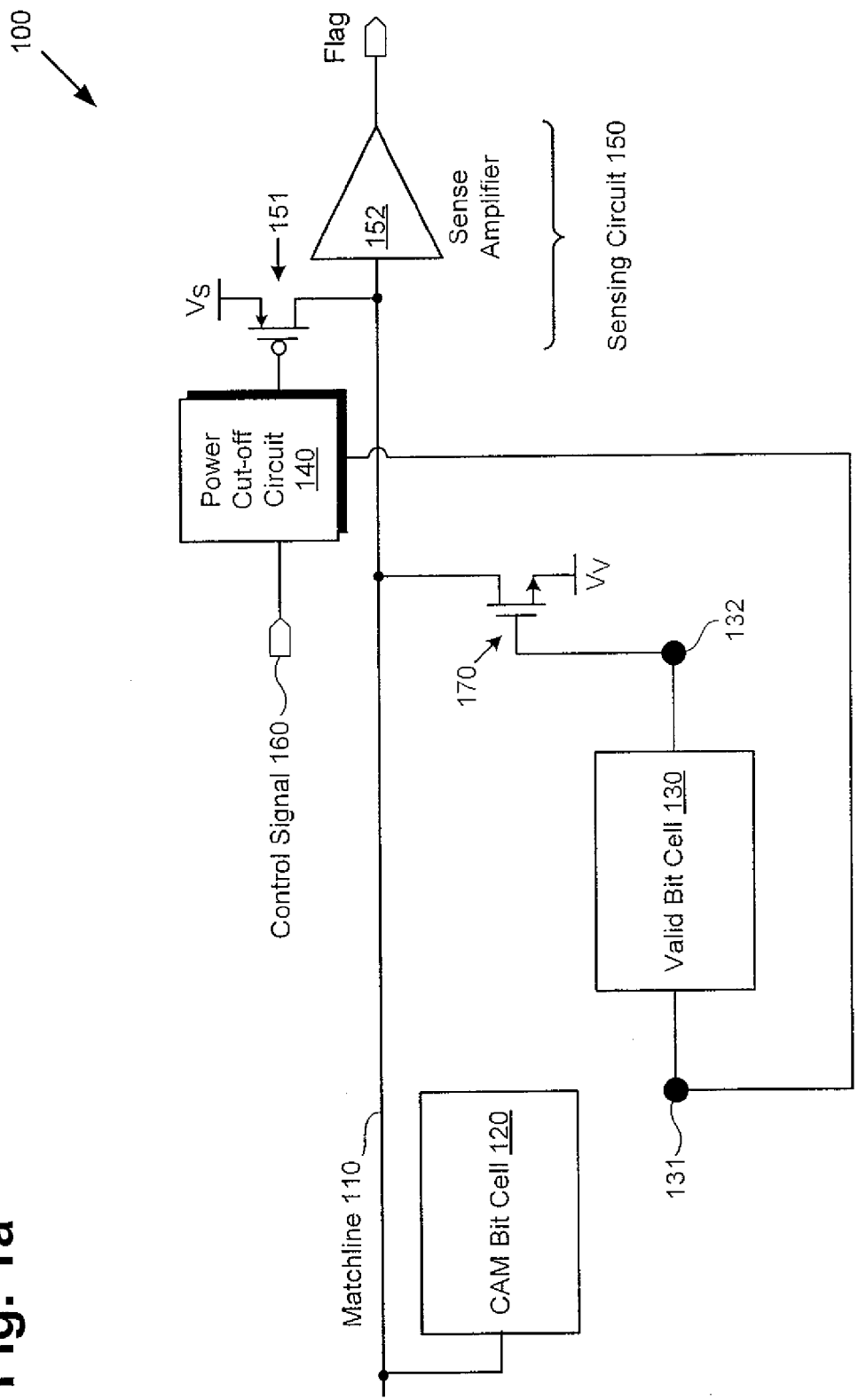
FIG. 1a illustrates an equivalent circuit schematic of a content-addressable memory (CAM) system, according to an embodiment of the present invention.

The present invention is directed to system and method for reducing power consumption in a content-addressable memory (CAM). The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1a illustrates a CAM system configured for reduced power consumption, according to one embodiment of the present invention. As shown in FIG. 1a, CAM system 100 includes matchline 110, CAM bit cell 120, valid bit cell 130, power cut-off circuit 140, switching circuit 170 and sensing circuit 150 including pull-up transistor 151 and sense amplifier 152. Other structures used to enable basic CAM functionality, such as a means to populate CAM bit cell 120 with data, for example, have been left out of FIG. 1a in order not to obscure the invention, but such structures are well known to those skilled in the art.

CAM system 100 is configured to take a match or mismatch state of CAM bit cell 120 and propagate it out to other circuitry not shown in FIG. 1a. Specifically, CAM system 100 is configured to take a match or mismatch state of CAM bit cell 120 and apply it to matchline 110 while control signal 160 forces sensing circuit 150 to apply sense voltage $V_S$ to matchline 110. For example, CAM system 100 may be configured so that a logic-high state on matchline 110 indicates a match state. If sense voltage $V_S$ is correspondingly configured as logic-high and CAM bit cell 120 is in a mismatch state, as known in the art, CAM bit cell 120 may be configured to drive matchline 110 to a logic-low state by overpowering pull-up transistor 151 of sensing circuit 150, for example. In such case, sense amplifier 152 of sensing circuit 150 may supply a logic-low state as output of CAM system 100 to a flag port, as shown in FIG. 1a. A logic-low state at a flag port may indicate a mismatch state for CAM system 100 to other circuitry (not shown in FIG. 1a). Correspondingly, when CAM bit cell 120 is in a match state, as known in the art, CAM bit cell 120 may be configured to apply such match state to matchline 110 by decoupling itself from matchline 110 in order not to disturb sense voltage $V_S$, resulting in a logic-high match state at a flag port of CAM system 100.

Although not explicitly shown in FIG. 1a, CAM system 100 may comprise any number of additional CAM bit cells also attached to matchline 110, each supplying a match or mismatch state to matchline 110, as described above. Matchline 110 may accordingly be coupled to a full entry of a larger CAM system or CAM array, or may be coupled to just a segment of a full entry, as known in the art. Furthermore, although sensing circuit 150 is shown as comprising sense amplifier 152 and a P type metal-oxide-semiconductor (PMOS) device as pull-up transistor 151, this particular arrangement is not meant to limit the scope of the invention. However, where sensing circuit 150 does include a pull-up transistor, such pull-up transistor (e.g., pull-up transistor 151) may comprise a PMOS transistor in order to reduce power consumption due to leakage current, as known in the art.

As can be seen from FIG. 1a and the above discussion, a mismatch in CAM bit cell 120 or any CAM bit cells attached to matchline 110 may cause a large power draw in CAM system 100 due to a voltage contention between the applied sense voltage $V_S$ and a logic-low state applied by, for example, CAM bit cell 120. Because CAM systems may comprise many CAM bit cells and matchlines, each with their own sensing circuits, and since typical CAM searches may result in most if not all matchlines being in a mismatch state, the power draw described above with respect to FIG. 1a may be compounded across an entire CAM array and so may be a large component of overall power consumption by a conventional CAM system.

However, as previously noted, CAM system 100 also includes valid bit cell 130 and switching circuit 170. Valid bit cell 130 may be incorporated into CAM system 100 in order to add programmatic functionality to CAM system 100 and thus further offload processor use and data bus throughput, as known in the art. Valid bit cell 130 may be configured to apply a validity state to matchline 110, for example, such that when an "invalid" validity state is stored in valid bit cell 130, a mismatch state for CAM system 100 may be indicated at a corresponding flag port regardless of whether any CAM bit cells attached to matchline 110 have applied a mismatch state to matchline 110.

For example, valid bit cell 130 may exhibit two nodes 131 and 132 that are logic complements of each other. As such, when a "valid" validity state is stored within valid bit cell 130, node 131 may be driven logic-high and node 132 may be driven logic-low, thereby forcing switching circuit 170, for example, to isolate a validity voltage $V_V$ from matchline 110. During such a valid validity state, CAM bit cell 120 may control the status of matchline 110, as described previously. During an invalid validity state, however, CAM bit cell 120 may not determine the status of matchline 110.

Typically, in order to be capable of overriding a match state of matchline 110, validity voltage $V_V$ may be configured as a logical complement of sense voltage $V_S$. As such, if an invalid validity state is stored in valid bit cell 130 and node 132 is accordingly driven logic-high, switching circuit 170 may be configured to then apply validity voltage $V_V$ to matchline 110 and, for example, drive matchline 110 logic-low regardless of the state of CAM bit cell 120. As can be seen in FIG. 1a, this may cause additional power consumption in CAM system 100 due to additional voltage contention between validity voltage $V_V$ and an applied sense voltage $V_S$. Thus, although valid bit cell 130 may provide performance advantages for CAM system 100, valid bit cell 130 may also increase overall power consumption by CAM system 100.

In order to counteract the undesirable power consumption effects of voltage contention across matchline 110, as described above, as well as to incorporate as little additional circuitry as possible in order to reduce fabrication cost, CAM system 100 includes power cut-off circuit 140 advantageously coupled to valid bit cell 130, as shown in FIG. 1a. Power cut-off circuit 140 may be configured to reduce power consumption in CAM system 100 by isolating sense voltage $V_S$ from matchline 110 when an invalid validity state is stored in valid bit cell 130.

For example, as shown in FIG. 1a, when an invalid validity state is stored in valid bit cell 130, node 131 may be driven logic-low, which may cause power cut-off circuit 140 to decouple control signal 160 from pull-up transistor 151. As such, pull-up transistor 151 may not receive a signal to couple sense voltage $V_S$ to matchline 110, thereby reducing a possibility of voltage contention between sense voltage $V_S$ and a mismatch state applied to matchline 110 by CAM bit cell 120. Furthermore, the decoupling also removes a possibility of voltage contention between sense voltage $V_S$ and validity voltage $V_V$, thereby further reducing overall power consumption by CAM system 100.

Other embodiments of the present invention may place power cut-off circuit 140 directly between sense voltage $V_S$ and pull-up transistor 151 or directly between pull-up transistor 151 and matchline 110, rather than between control signal 160 and pull-up transistor 151, in order to simplify power cut-off circuit 140, as will be described more fully below.

Also, although FIG. 1a shows valid bit cell 130 coupled to a single matchline 110 and power cut-off circuit 140, other embodiments may include valid bit cell 130 coupled to many separate matchlines and power cut off circuits of a CAM array in order to apply a power conserving invalid validity state to multiple rows or row blocks of full entries, or row blocks of segments of full entries, substantially concurrently. Additionally, although not explicitly shown in FIG. 1a, one skilled in the art should recognize that the present invention may be used with both binary and ternary CAM systems. It is also noted that although FIG. 1a presents CAM system 100 as using a logic-high state to represent a match state, other embodiments may comprise a CAM system configured to use a logic-low state or a biased state to represent a match state.

By removing the additional power consumption caused by voltage contention between a validity voltage and a sense voltage, as explained above, embodiments of the present invention allow valid bit cell functionality to be added to all levels of CAM array granularity without also requiring the extra circuitry and thermal design considerations, for example, needed to support a large increase in power consumption. As such, embodiments of the present invention advantageously reduce the complexity and therefore cost of implementing corresponding performance enhancements in such CAM systems. Furthermore, by linking the operation of a power cut-off circuit to valid bit cell functionality, embodiments of the present invention provide the aforementioned advantages in a compact as well as cost-effective CAM system.

In addition to the above, because the present invention may be used to effectively shut down large blocks of a CAM array when, for example, it is not being used by a particular application, a CAM system fabricated according to the present inventive concepts may be configured to use less power over time than conventional CAM systems, thereby allowing its use in a wider selection of, for example, low power applications. Moreover, a CAM system fabricated according to the present inventive concepts may also be designed more generically for a wide selection of applications with less concern for matching a specific size CAM array, and therefore a specific maximum power consumption specification (e.g., for a conventional CAM system), to a specific use. Thus, embodiments of the present invention may allow for cost reductions in the manufacturing of CAM-based devices generally.

Figure 1B:
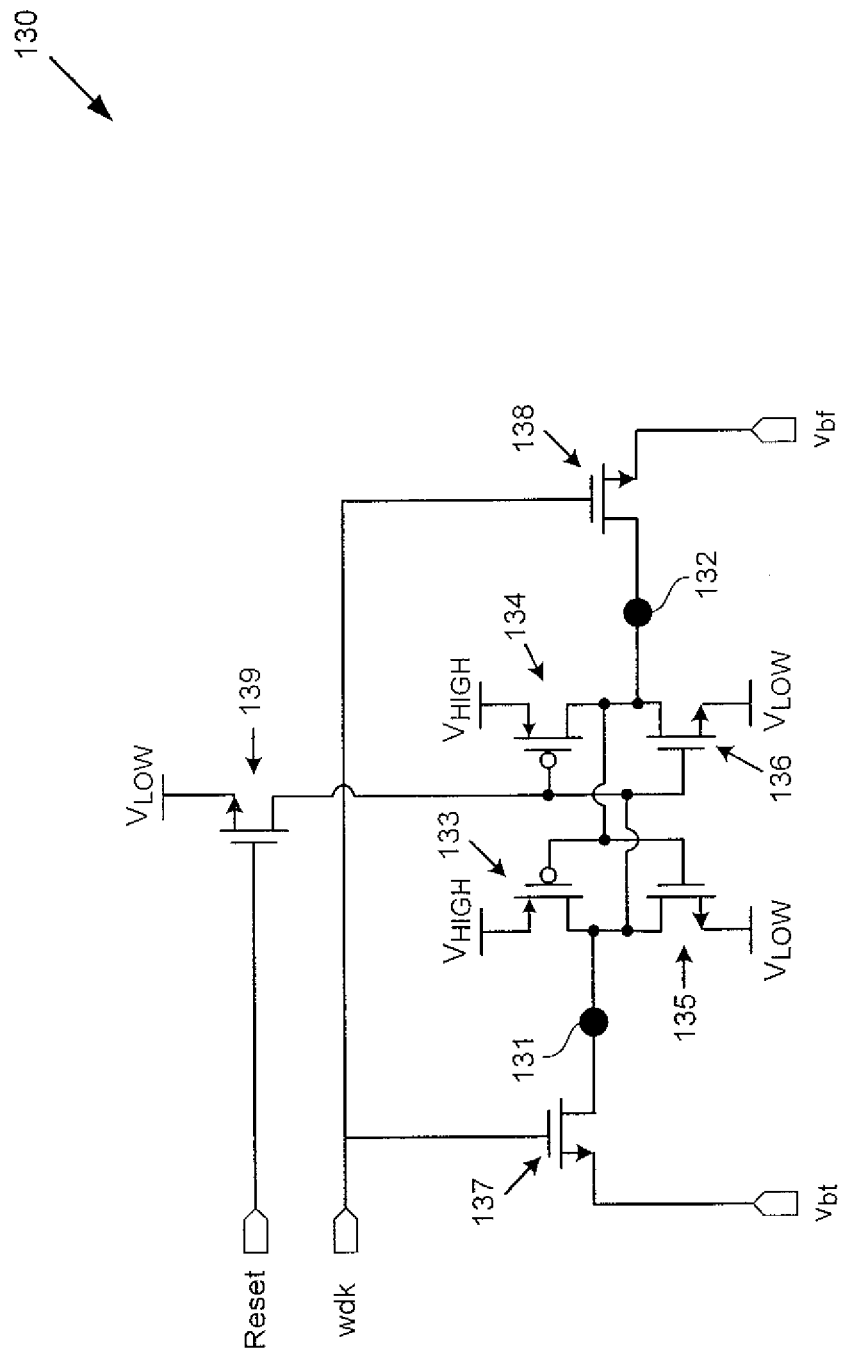

Turning now to FIG. 1b, FIG. 1b shows one example embodiment of valid bit cell 130 advantageously configured to couple with power cut off circuit 140 of FIG. 1a and reduce power consumption by CAM system 100. Valid bit cell 130 of FIG. 1b may comprise two PMOS transistors 133 and 134 and two N type MOS (NMOS) transistors 135 and 136 in a standard flip-flop configuration as known in the art. Valid bit cell 130 may additionally comprise control transistors 137 and 138 that may be used, in conjunction with various control ports, to program or store a particular validity state in valid bit cell 130. Also shown in FIG. 1b is transistor 139, which may be used to provide reset functionality to valid bit cell 130, for example. As can be seen from FIG. 1b, valid bit cell 130 may be configured to provide complementary logic states at nodes 131 and 132 that depend on the validity state stored in the cell, for example, thus enabling one to couple power cut-off circuit 140 of FIG. 1a to valid bit cell 130, as described above.

Figure 2:
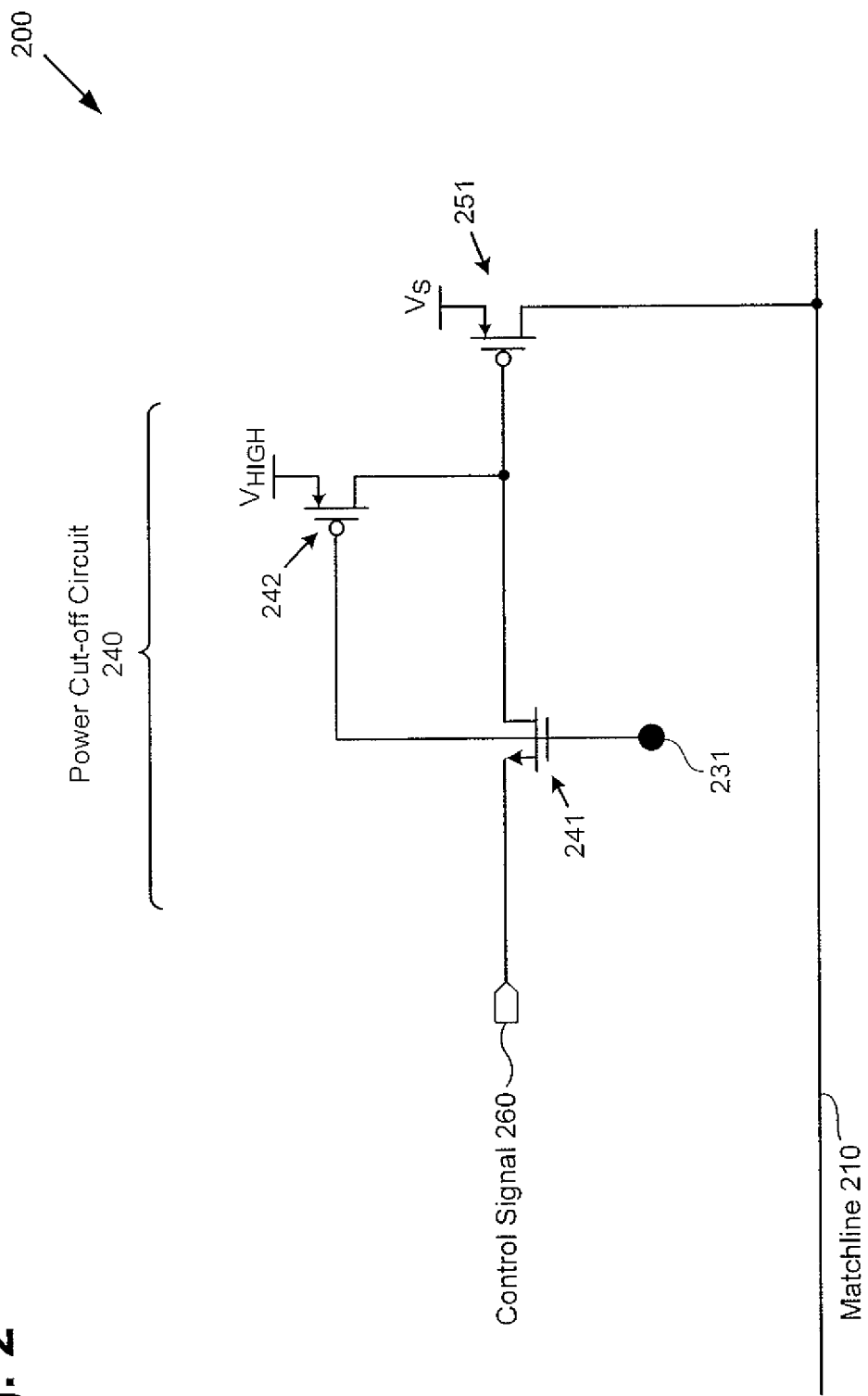
FIG. 2 illustrates an equivalent circuit schematic of a CAM system, according to an embodiment of the present invention.

Turning to FIG. 2, FIG. 2 illustrates an embodiment of a power cut-off circuit that may be used to isolate a sense voltage from a matchline, as described above. CAM environment 200, in FIG. 2, includes matchline 210, node 231, power cut-off circuit 240, pull-up transistor 251 and control signal 260 corresponding respectively to matchline 110, node 131, power cut-off circuit 140, pull-up transistor 151 and control signal 160 in CAM system 100 of FIG. 1a, and each corresponding element may be configured to exhibit the same features and/or operate substantially the same as its counterpart.

In addition, power cut-off circuit 240 includes NMOS transistor 241 with its gate connected to node 231. As such, NMOS transistor 241 may be configured to couple control signal 260 to pull-up transistor 251, for example, when a valid validity state is stored in a coupled valid bit cell (not shown in FIG. 2) and so allow normal function of an associated CAM system, as explained previously with reference to CAM system 100. Correspondingly, NMOS transistor 241 may also be configured to decouple control signal 260 from pull-up transistor 251 when an invalid validity state is stored in a coupled valid bit cell, thus isolating sense voltage $V_S$ from matchline 210.

Power cut-off circuit 240 also includes PMOS transistor 242 with its gate also connected to node 231. In the event that an invalid validity state is stored in a coupled valid bit cell, PMOS transistor 242 may be configured to affirmatively force pull-up transistor 251 to isolate sense voltage $V_S$ from matchline 210 by supplying a logic-high state, for example, to the gate of pull-up transistor 251. PMOS transistor 242 may be configured to overpower control signal 260, for example, in embodiments where power cut-off circuit 240 lacks NMOS transistor 241. Alternatively, in cases where NMOS transistor 241 has decoupled control signal 260 from pull-up transistor 251, PMOS transistor 242 may be configured to remove a possibility of intermittent isolation of sense voltage $V_S$ from matchline 210 caused by a floating gate of pull-up transistor 251.

Figure 3:
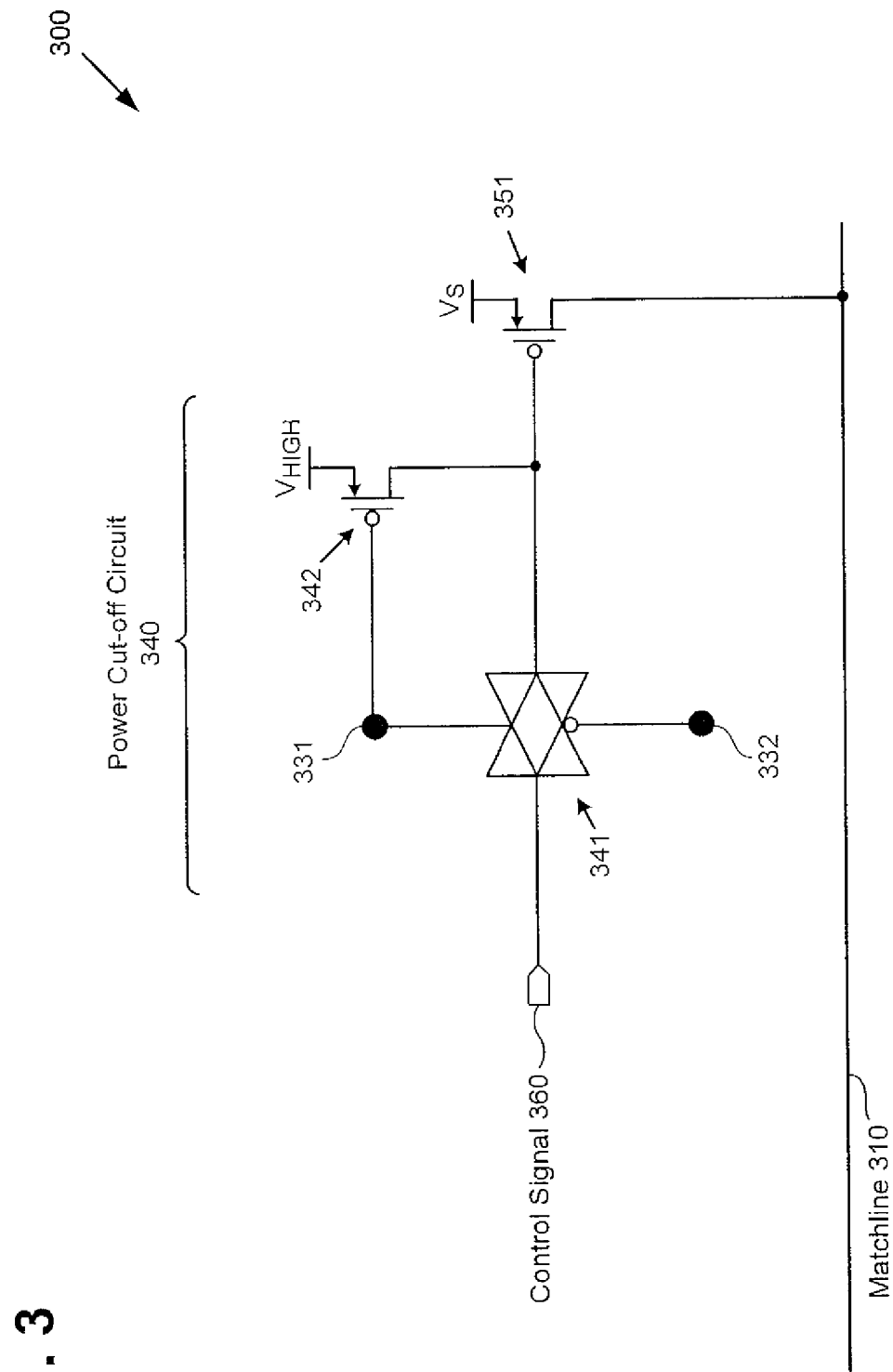
FIG. 3 illustrates an equivalent circuit schematic of a CAM system, according to an embodiment of the present invention.

Discussing FIG. 3, FIG. 3 illustrates an embodiment of a power cut-off circuit that may be used to isolate a sense voltage from a matchline, as described above. CAM environment 300 of FIG. 3 includes matchline 310, node 331, power cut-off circuit 340, pull-up transistor 351 and control signal 360 corresponding respectively to matchline 210, node 231, power cut-off circuit 240, pull-up transistor 251 and control signal 260 in CAM environment 200 of FIG. 2. CAM environment 300 also includes node 332 corresponding to node 132 in CAM system 100 of FIG. 1a. Each corresponding element may be configured to exhibit the same features and/or operate substantially the same as its counterpart, as described above.

One difference between power cut-off circuit 340 embodied in FIG. 3, and power cut-off circuit 240, in FIG. 2, is that power cut-off circuit 340 comprises transmission gate 341 in place of NMOS transistor 241 of power cut-off circuit 240. Transmission gate 341 and NMOS transistor 241 may be configured to perform the same general function, e.g., to isolate a control signal from a pull-up transistor, as explained above. However, by using transmission gate 341 coupled to both complementary nodes 331 and 332 of a coupled valid bit cell instead of an NMOS transistor 241 coupled to a single node 231, power cut-off circuit 340 may be capable of decoupling control signal 360 to/from pull-up transistor 351 more precisely and more quickly than power cut-off circuit 240. Furthermore, when coupling control signal 360 to pull-up transistor 351, power cut-off circuit 340 may also be capable of driving the gate of pull-up transistor 351, in response to control signal 360, more precisely and more quickly than power cut-off circuit 240. For example, when coupling control signal 360 to pull-up transistor 351, transmission gate 341 can drive the gate of pull-up transistor 351 all the way logic-high relatively strongly and quickly, in response to control signal 360, whereas a simple NMOS transistor in place of transmission gate 341 would only be able to relatively weakly drive the gate of pull-up transistor 351 to a voltage level equal to a logic-high voltage less the NMOS transistor's threshold voltage. The additional precision and speed of power cut-off circuit 340 allows representative embodiments of the present invention to operate reliably at higher overall speeds while retaining substantially all the additional benefits detailed above.

Under circumstances where chip space is at a premium, one embodiment of the present invention not explicitly shown in the present figures may include a power cut-off circuit comprising a single transistor, for example, such as a single PMOS transistor. For instance, a single PMOS transistor may be cascoded with a pull-up transistor of a sensing circuit, such as pull-up transistor 151 of sensing circuit 150 in FIG. 1a. The cascoded PMOS transistor may include a gate coupled to a node of a valid bit cell, such as node 132 in FIG. 1a, and may be situated either between sense voltage $V_S$ and pull-up transistor 151, or between pull-up transistor 151 and matchline 110, for example, such that when an invalid validity state is stored in the coupled valid bit cell, the PMOS transistor may isolate sense voltage $V_S$ from matchline 110. Such a configuration simplifies the design of the power cut-off circuit while significantly reducing the space needed to implement the present inventive concepts. Moreover, the use of a PMOS transistor may serve to reduce power consumption caused by leakage current.

Figure 4:
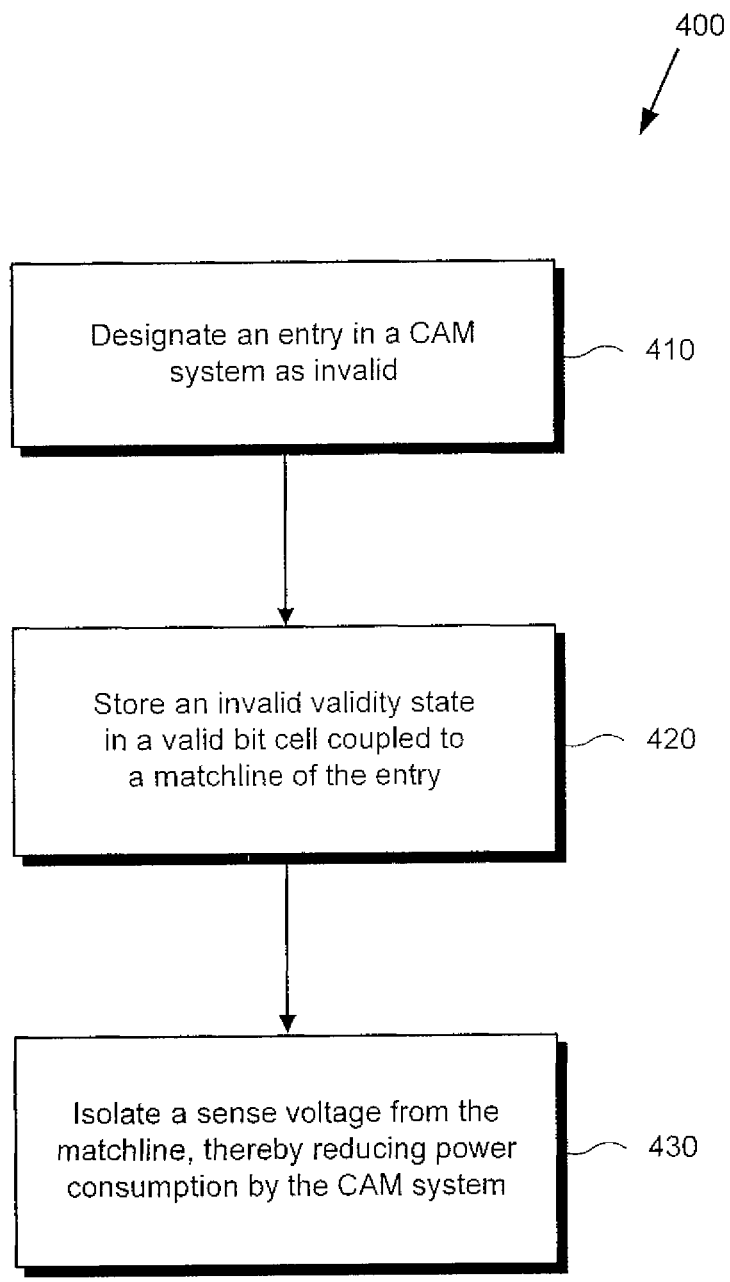
FIG. 4 shows a flowchart illustrating steps taken to implement a method for reducing power consumption by a CAM, according to an embodiment of the present invention.

Turning to FIG. 4, FIG. 4 shows flowchart 400 illustrating a method for reducing power consumption by a CAM, according to an embodiment of the present invention. Certain details and features have been left out of flowchart 400 that are apparent to a person of ordinary skill in the art. For example, a step may consist of one or more substeps or may involve specialized equipment or materials, as known in the art. Steps 410 through 430 indicated in flowchart 400 are sufficient to describe one embodiment of the present invention; however, other embodiments of the invention may make use of steps different from those shown in flowchart 400. It is noted that FIG. 1a illustrates a system capable of performing the method of flowchart 400, and so steps 410 through 430 are described with reference to CAM system 100 in FIG. 1a and valid bit cell 130 in FIG. 1b.

Referring now to step 410 of the method embodied in FIG. 4, step 410 of flowchart 400 comprises designating an entry in a CAM system as invalid. As described above, designating an entry as invalid results in a mismatch state assigned to that entry regardless of the state of any CAM bit cells of that entry. An entry may comprise a full entry of a CAM system, or may comprise a segment or subset of a full entry of a CAM system, as known in the art. A particular entry may be designated invalid by default at the initialization of a CAM system, or may be programmatically designated invalid during the normal operation of a CAM system, for example, in order to proactively reduce needless power consumption when portions of the system are unused, as described previously. Moreover, a particular entry may be designated invalid to further offload processing functionality, for example, as explained above.

Continuing with step 420 in FIG. 4, step 420 of flowchart 400 comprises storing an invalid validity state in a valid bit cell coupled to a matchline of the entry. As shown in FIG. 1b, an invalid validity state may be stored in valid bit cell 130, for example, by enabling control transistors 137 and 138 and then applying a logic-low state to node 131 and a logic-high state to node 132 using a variety of control ports, as known in the art. In some embodiments, an invalid validity state may be stored in valid bit cell 130 by simply resetting valid bit cell 130 using transistor 139. Valid bit cell 130 may be coupled to a matchline of a CAM system, as shown in FIG. 1a, by coupling valid bit cell 130 to matchline 110 through switching circuit 170.

Moving to step 430 in FIG. 4, step 430 of flowchart 400 comprises isolating a sense voltage from the matchline, thereby reducing power consumption by the CAM system. As discussed previously, power cut-off circuit 140 may isolate sense voltage $V_S$ from matchline 110 by decoupling control signal 160 from pull-up transistor 151, in FIG. 1a. Power cut-off circuit 140 may be configured to decouple control signal 160 from pull-up transistor 151 when an invalid validity state is stored in valid bit cell 130 and a logic-low state is applied to node 131, as described above. Once sense voltage $V_S$ is isolated from matchline 110, there is a significantly reduced possibility of voltage contention between sense voltage $V_S$ and, for example, a mismatch state applied by CAM bit cell 120 or an applied validity voltage $V_V$, and so power consumption by CAM system 100 is reduced.

Thus, various embodiments of the present invention provide systems and methods for reducing power consumption in a CAM system. In particular, the present invention provides a method for reducing power consumption by coupling a valid bit cell with a power cut-off circuit, which facilitates valid bit cell functionality even at the single CAM bit cell level, as explained above. This, in combination with the overall power reduction offered by embodiments of the present invention, may allow CAM-based devices to be manufactured inexpensively, which would increase their use in a variety of new and low-power applications.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A content-addressable memory (CAM) system comprising:
    a sensing circuit; and
    a valid bit cell coupled to a power cut-off circuit, wherein said power cut-off circuit is configured to isolate said sensing circuit when an invalid validity state is stored in said valid bit cell.

2. The CAM system of claim 1, wherein said power cut-off circuit is configured to decouple said sensing circuit from a control signal when said invalid validity state is stored in said valid bit cell.

3. The CAM system of claim 1, wherein said power cut-off circuit is configured to force said sensing circuit to decouple a sense voltage from a matchline of said CAM system when said invalid validity state is stored in said valid bit cell.

4. The CAM system of claim 3, further comprising a switching circuit configured to couple said valid bit cell to said matchline.

5. The CAM system of claim 4, wherein said switching circuit is configured to apply a validity voltage different from said sense voltage to said matchline when said invalid validity state is stored in said valid bit cell.

6. The CAM system of claim 1, wherein said power cut-off circuit comprises an NMOS transistor and a PMOS transistor.

7. The CAM system of claim 1, wherein said power cut-off circuit comprises a transmission gate and a PMOS transistor.

8. The CAM system of claim 1, wherein said power cut-off circuit comprises a single PMOS transistor.

9. The CAM system of claim 3, wherein said matchline is coupled to one segment of a full entry of said CAM system.

10. The CAM system of claim 1, further comprising a row block of one or more full entries of said CAM system.

11. The CAM system of claim 10, wherein said valid bit cell is coupled to matchlines of said row block.

12. The CAM system of claim 1, further comprising a row block of one or more segments of full entries of said CAM system.

13. The CAM system of claim 12, wherein said valid bit cell is coupled to matchlines of said row block.

14. A method for reducing power consumption by a content-addressable memory (CAM) system, said method comprising:
    designating an entry in said CAM system as invalid;
    storing an invalid validity state in a valid bit cell; and
    isolating a sensing circuit from a matchline of said CAM system by a power cut-off circuit.

15. The method of claim 14, wherein said power cut-off circuit is configured to decouple said sensing circuit from a control signal when said invalid validity state is stored in said valid bit cell.

16. The method of claim 14, wherein said power cut-off circuit is configured to force said sensing circuit to decouple a sense voltage from said matchline of said CAM system when said invalid validity state is stored in said valid bit cell.

17. The method of claim 16, further comprising a switching circuit configured to couple said valid bit cell to said matchline.

18. The method of claim 17, wherein said switching circuit is configured to apply a validity voltage different from said sense voltage to said matchline when said invalid validity state is stored in said valid bit cell.

19. The method of claim 14, wherein said power cut-off circuit comprises an NMOS transistor and a PMOS transistor.

20. The method of claim 14, wherein said power cut-off circuit comprises a transmission gate and a PMOS transistor.

* * * * *